United States Patent
Cheng et al.

(10) Patent No.: US 9,908,779 B2
(45) Date of Patent: Mar. 6, 2018

(54) APPARATUS AND METHOD FOR TREATING GRAPHENE USING PLASMA AND APPLICATION THEREOF

(71) Applicant: NATIONAL TAIWAM UNIVERSITY, Taipei (TW)

(72) Inventors: I-Chun Cheng, Taipei (TW); Jian-Zhang Chen, Taipei (TW); Cheng-Che Hsu, Taipei (TW); Pi-Tai Chou, Taipie (TW); Hsiao-Wei Liu, Taipei (TW); Haoming Chang, Taipei (TW); Sheng-Ping Liang, Taipei (TW); Ting-Jui Wu, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 83 days.

(21) Appl. No.: 14/701,471

(22) Filed: Apr. 30, 2015

(65) Prior Publication Data
US 2015/0315026 A1 Nov. 5, 2015

(30) Foreign Application Priority Data
Apr. 30, 2014 (TW) .............................. 103115622 A

(51) Int. Cl.
| | |
|---|---|
| *B05D 3/06* | (2006.01) |
| *C01B 31/04* | (2006.01) |
| *C23C 18/12* | (2006.01) |
| *H01J 37/32* | (2006.01) |
| *C23C 18/14* | (2006.01) |
| *C23C 4/134* | (2016.01) |

(52) U.S. Cl.
CPC ........ *C01B 31/043* (2013.01); *C01B 31/0484* (2013.01); *C23C 4/134* (2016.01); *C23C 18/1262* (2013.01); *C23C 18/1295* (2013.01); *C23C 18/14* (2013.01); *H01J 37/32357* (2013.01)

(58) Field of Classification Search
CPC . C23C 18/1262; C23C 18/1295; C23C 18/14; C01B 31/043; C01B 31/0446; C01B 31/0484; H01J 37/32–37/32788; H01J 2237/336; H01J 2237/3365; H01J 2237/338; H01J 2237/3382
USPC ......................... 427/534, 535, 536, 539, 562
See application file for complete search history.

(56) References Cited

U.S. PATENT DOCUMENTS

| | | | | |
|---|---|---|---|---|
| 6,534,921 B1 * | 3/2003 | Seo | ....................... | B08B 7/0035 134/1.1 |
| 9,406,485 B1 * | 8/2016 | Cheng | ............... | H01J 37/32183 |

(Continued)

FOREIGN PATENT DOCUMENTS

| | | | | |
|---|---|---|---|---|
| CN | 102903539 A | | 1/2013 | |
| CN | 103710759 A | * | 4/2014 | ............. C30B 31/20 |

OTHER PUBLICATIONS

Richard J. Lewis, Sr., editor; Hawley's Condensed Chemical Dictionary, 12th edition; Van Nostrand Reinhold company, New York; 1993 (no month); excerpt pp. 483 & 1124.*

(Continued)

*Primary Examiner* — Marianne L Padgett
(74) *Attorney, Agent, or Firm* — The PL Law Group, PLLC

(57) ABSTRACT

A method and apparatus for treating graphene raw material by plasma, and an application thereof are provided. After (Continued)

treated by the plasma, the graphene raw material will have a special structure and characteristic.

6 Claims, 10 Drawing Sheets

(56) References Cited

U.S. PATENT DOCUMENTS

| | | | | |
|---|---|---|---|---|
| 2005/0118350 A1* | 6/2005 | Koulik | ............. | H05H 1/44 427/535 |
| 2007/0053168 A1* | 3/2007 | Sayir | ............. | B32B 18/00 361/718 |
| 2007/0072433 A1* | 3/2007 | Yoon | ............. | H01L 21/02087 438/707 |
| 2009/0311540 A1* | 12/2009 | Cohen | ............. | B05D 1/18 428/447 |
| 2010/0038766 A1* | 2/2010 | Ikeda | ............. | H01L 24/24 257/686 |
| 2011/0059599 A1* | 3/2011 | Ward | ............. | B82Y 30/00 438/507 |
| 2011/0111236 A1* | 5/2011 | Pahl | ............. | C09J 5/02 428/457 |
| 2011/0165321 A1* | 7/2011 | Zhamu | ............. | B82Y 30/00 427/79 |
| 2013/0171452 A1* | 7/2013 | Goela | ............. | H01B 1/06 428/408 |
| 2013/0184143 A1* | 7/2013 | Corral | ............. | C04B 35/632 501/154 |
| 2014/0141355 A1* | 5/2014 | Huang | ............. | H01G 11/38 429/482 |
| 2014/0154464 A1* | 6/2014 | Miller | ............. | B01D 39/2055 428/137 |
| 2014/0234680 A1* | 8/2014 | Yoon | ............. | H01G 11/36 429/94 |
| 2015/0110972 A1* | 4/2015 | Chang | ............. | B05D 1/005 427/565 |
| 2017/0162873 A1* | 6/2017 | Huang | ............. | H01G 11/38 |

OTHER PUBLICATIONS

A. Schulze et al.; "The Atmospheric-Pressure Plasma Jet: A Review and Comparison to Other Plasma Sources"; iIEEE Transactions on Plasma Science; vol. 26, No. 6; Dec. 1998; pp. 1685-1694.*
G.S. Selwyn et al.; "Materials Processing using an Atmospheric-Pressure Plasma Jet"; Physics Division Progress Report 1999-2000; Research Highlights; pp. 189-197.*
Office action dated Aug. 26, 2015 from the TW Patent Office.
Van-Duong Dao et al., Graphene—platinum nanohybrid as a robust and low-cost counter electrode for dye-sensitized solar cells, Naniscale, 2013, 5, pp. 12237-12244.

* cited by examiner

APPARATUS AND METHOD FOR TREATING GRAPHENE USING PLASMA AND APPLICATION THEREOF

CROSS-REFERENCE TO RELATED APPLICATION AND CLAIM OF PRIORITY

This application claims the benefit of Taiwan Patent Application No. 103115622, filed on Apr. 30, 2014, at the Taiwan Intellectual Property Office, the disclosures of which are incorporated herein in their entirety by reference.

FIELD OF THE INVENTION

The present disclosure is directed to a method and apparatus for treating an initial graphene material with plasma, and the application thereof. After the treatment, the initial graphene material will be transformed into a graphene film with a special structure and characteristic.

BACKGROUND OF THE INVENTION

With the reserve of fossil fuel in the earth decreasing, the use of solar power becomes an important trend in energy technology development. Since 1954, the development of solar cells has sustained several generations, where dye-sensitized solar cells (DSSCs) belong to the third generation. The power generating principle of the DSSCs is different from that of conventional silicon-based solar cells using contact of n-type and p-type semiconductors (pn junction). A DSSC is a photoelectrochemical system that uses various chemical reactions to transfer light energy to electrical energy. Compared to other types of solar cells, the greatest advantages of DSSCs are low cost and simply manufacturing process. In addition, the substrate in the DSSC can be made of soft materials so as to cause the DSSC flexible.

A DSSC is composed of a photoelectrode, a counter electrode and electrolyte. Generally, the photoelectrode is photosensitive dye-adsorbed mesoporous $TiO_2$ coated on a fluorine-doped tin oxide (FTO) conductive glass, the counter electrode is a conductive glass coated with a platinum film, and the electrolyte is ionic liquid containing $I^-/I_3^-$ redox couples. By light irradiation, the photosensitive dye on the $TiO_2$ absorbs the light and is excited to inject electrons into the conduction band of the $TiO_2$. The electrons flow to the external circuit from the $TiO_2$ through the FTO glass, and arrive at the Pt electrode. On the Pt electrode, the $I_3^-$ ion in the electrolyte gets the electrons and is reduced to an $I^-$ ion, and the $I^-$ ion is oxidized by the positively charged dye molecule. Then, the positively charged dye molecule is reduced to a natural molecule, and another $I_3^-$ ion is generated to complete an electron conduction circuit. The circuit is repeated continuously to convert the light energy to the electrical energy.

Graphene is a kind of allotrope of carbon, can be considered as a single layer of graphite, and therefore has a unique two-dimensional structure with the thickness of a single atomic layer. In the two-dimensional plane of graphene, carbon atoms are arranged in hexagonal honeycomb structures, where each carbon atom maintains $sp^2$ bond with its three adjacent carbon atoms to produce excellent planar conductivity. In 2004, the team of Novoselov and Geim mechanically peeled out the graphene having the thickness of several atomic layers from graphite. This method is simply and cheap. In addition, the peeled graphene has a carrier concentration up to $10^{13}$ $cm^{-2}$, and a carrier migration rate of 10000 $cm^2V^{-1}s^{-1}$ at room temperature. In addition to electrical properties, the graphene has good optical and heat-transfer characteristics; therefore, it is applicable to many fields or products, such as transistors, photodetectors, transparent conductive films and energy harvesting and/or storage devices.

The Taiwan Patent Application No. 099129474, entitled "Graphene transparent electrode, graphene light emitting diode, and method of fabricating the graphene light emitting diode", discloses a graphene transparent electrode comprising at least one graphene sheet with a specific diameter.

The Taiwan Patent Application No. 100137740, entitled "Electrode performance enhancement by composite formation with graphene oxide", discloses an electrode comprising an electronically active material (EAM) in a nanoparticulate form and a matrix having a pyrolization product incorporated with graphene flakes.

The Taiwan Patent Application No. 100146689, entitled "Electrode material for chemical energy storage composed of three phase composite of metal oxide, graphene, and nano-carbon materials" discloses an electrode material includes nano-graphene, a nano-carbon material, and transition metal oxide. The nano-graphene is separated by the nano-carbon material, and the transition metal oxide is deposited on the surfaces of the nano-graphene and the nano-carbon material.

After substantial experiments and persistent research, the applicant has finally conceived an apparatus and method for treating graphene by plasma and the application thereof.

SUMMARY OF THE INVENTION

The present disclosure is directed to a method and apparatus for treating an initial graphene material with plasma, and the application thereof. After the treatment, the initial graphene material will be transformed into a film form graphene with a special structure and characteristic.

In another aspect, the present disclosure discloses a method for manufacturing a graphene film, comprising steps of providing a substrate; distributing graphene slurry on the substrate; causing the graphene slurry to distribute on the substrate; and treating the graphene slurry distributed on the substrate with an atmospheric pressure plasma jet (APPJ) to form the graphene film.

In another aspect, the present disclosure discloses a method for manufacturing three-dimensional graphene foam, comprising steps of providing graphene slurry; and treating the graphene slurry with an atmospheric pressure plasma jet (APPJ) to form the three-dimensional graphene foam.

In another aspect, the present disclosure discloses a system for manufacturing a graphene film, comprising a substrate having graphene slurry disposed thereon; and an atmospheric pressure plasma jet (APPJ) treating the graphene slurry to form the graphene film on the substrate.

DETAILED DESCRIPTION OF THE PREFERRED EMBODIMENT

Figure 1:
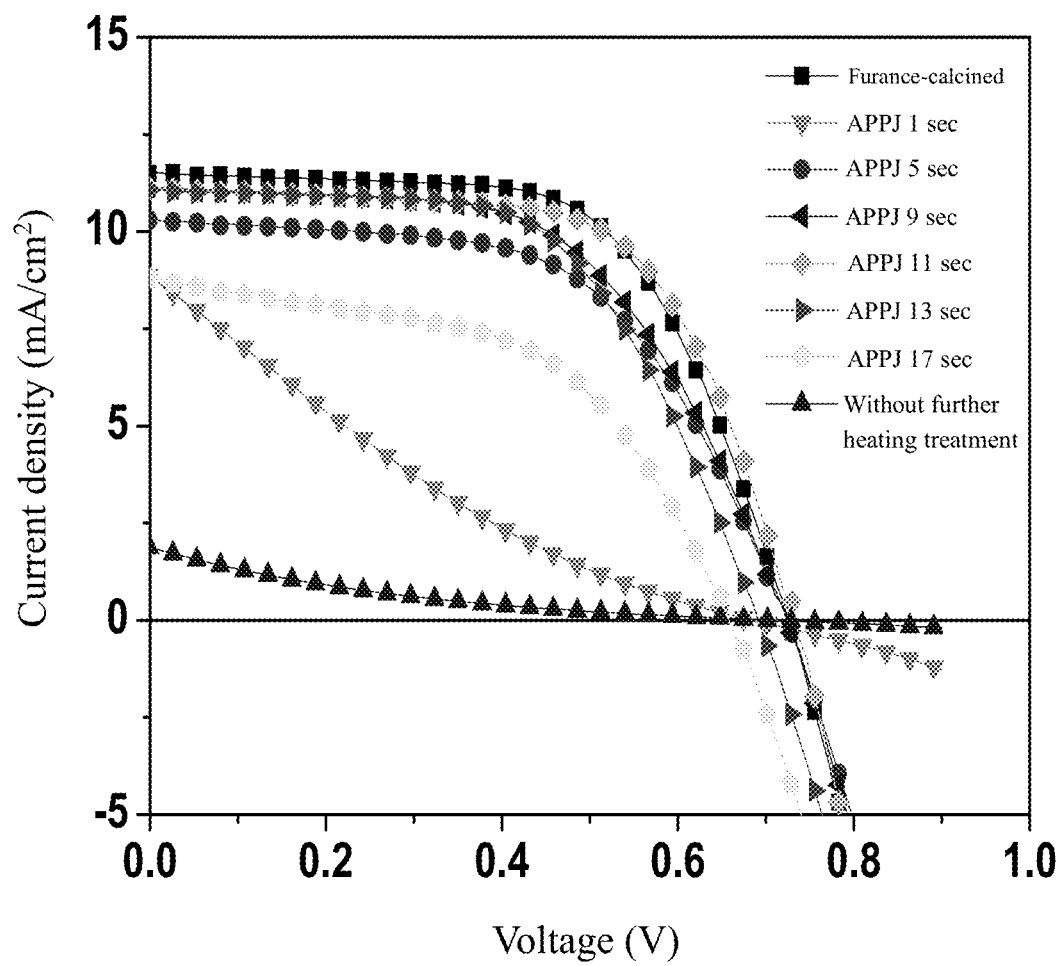
FIG. 1 is a diagram of voltage-current curves of DSSCs using various kinds of graphene counter electrodes.

The present disclosure can be fully understood and accomplished by the skilled person according to the following embodiments. However, the practice of present method is not limited to the following embodiments.

In an embodiment, the APPJ is used to treat graphene. Specifically, reduced graphene oxide (rGO) (60 mg) being graphene initial material is homogeneously mixed with 2 mL of viscous solution, containing solvent of α-terpineol and adhesive of ethyl cellulose (10 wt %), to form the graphene slurry. Next, the graphene slurry is screen printed on a cleaned fluorine-doped tin oxide (FTO) conductive glass substrate and then undergoes a soft bake process (100° C., 5 minutes) in an oven. The FTO substrate covered by the baked graphene slurry is put on a movable carrier which slowly moves under the APPJ. The operation parameters of the APPJ are a nitrogen flow rate of 30 slm, operating voltage of 275V and duty cycle of 7/33 microsecond. When the substrate is exposed to the APPJ, the substrate and the APPJ are 2 cm apart, and the opening of the quartz tube has a radius of 1.7 cm. The carrier moves slowly so as to prevent the FTO substrate from cracking due to drastic change of temperature. When the graphene slurry is treated by the APPJ according to the above-mentioned operation parameters, the working temperature of the FTO substrate is 450° C. In various embodiments, the graphene slurry is then treated by the APPJ for different durations, e.g. 1, 5, 9, 11, 13 and 17 seconds, once the FTO substrate reaches the working temperature due to the jet heat. After the APPJ treatment, the FTO substrate is slowly removed from the underneath of the APPJ, and the graphene slurry becomes a graphene film covers and is fixed on the FTO substrate. The FTO substrate covered thereon the graphene film can be seen as a graphene electrode.

A comparative embodiment that the FTO substrate covered thereon the soft-baked graphene slurry (having become a graphene film) is made according to the procedure identical to that of the above-mentioned APPJ embodiments, but it does not undergo any further heating treatment is provided to be a first comparative graphene electrode. Another comparative embodiment that the FTO substrate covered thereon the soft-baked graphene slurry is made according to the procedure identical to that of the above-mentioned APPJ embodiments, and then the graphene slurry is treated by conventional furnace calcination process (450° C., 15 minutes) is provided to be a second comparative graphene electrode. Each of the comparative graphene electrodes and the graphene electrodes treated by various APPJ-treating durations is used to be a counter electrode and assembled with a dye-absorbed $TiO_2$ photoanode, having a dense and a porous layers and treated by titanium tetrachloride, to form a DSSC. The photoelectric characteristics, including open circuit voltage ($V_{oc}$), short circuit current density ($J_{sc}$), fill factor (FF %) and photoelectric conversion efficiency (η %), of the respective DSSCs are measured and shown in Table 1.

TABLE 1

| Graphene counter electrode in DSSC | $V_{oc}$ (V) | $J_{sc}$ (mA/cm²) | FF (%) | η (%) |
|---|---|---|---|---|
| Without any further heating treatment | 0.71 | 1.88 | 14.29 | 0.19 |
| Furnace-calcined for 15 min | 0.73 | 11.50 | 62.25 | 5.19 |
| APPJ treated for 1 sec | 0.68 | 8.81 | 19.03 | 1.14 |
| APPJ treated for 5 sec | 0.72 | 10.29 | 57.36 | 4.28 |
| APPJ treated for 9 sec | 0.72 | 11.13 | 57.09 | 4.60 |
| APPJ treated for 11 sec | 0.73 | 11.11 | 63.82 | 5.19 |
| APPJ treated for 13 sec | 0.69 | 11.07 | 58.48 | 4.48 |
| APPJ treated for 17 sec | 0.66 | 8.76 | 39.95 | 3.01 |

As shown in Table 1, the photoelectric conversion efficiency of the DSSC using the first comparative graphene electrode (without treated by further heating treatment) is very low because the organics block the contact between electrolyte and reduced graphene oxide sheets and the conduction of electrons. In addition, the η of the DSSC using the graphene electrode treated by the conventional furnace calcination process is 5.19%. Regarding the DSSCs using the graphene electrodes treated by the APPJ, with the treating time increasing, the respective is correspondingly increase. The DSSC using the graphene electrode treated by the APPJ for 11 seconds has the η comparable to that of the DSSC using the graphene electrode treated by the conventional furnace calcination process, but the treating duration for the APPJ-treated graphene electrode decreases approximately 90% of that of the furnace-calcined graphene electrode. The major factor influencing the η is FF. When the FF is low, the η is poor. With the APPJ-treating duration increasing, the respective FFs of the DSSCs correspondingly increase.

The respective voltage-current curves of the DSSCs using the two comparative and the APPJ-treated counter graphene electrodes are shown in FIG. 1.

Figure 2:
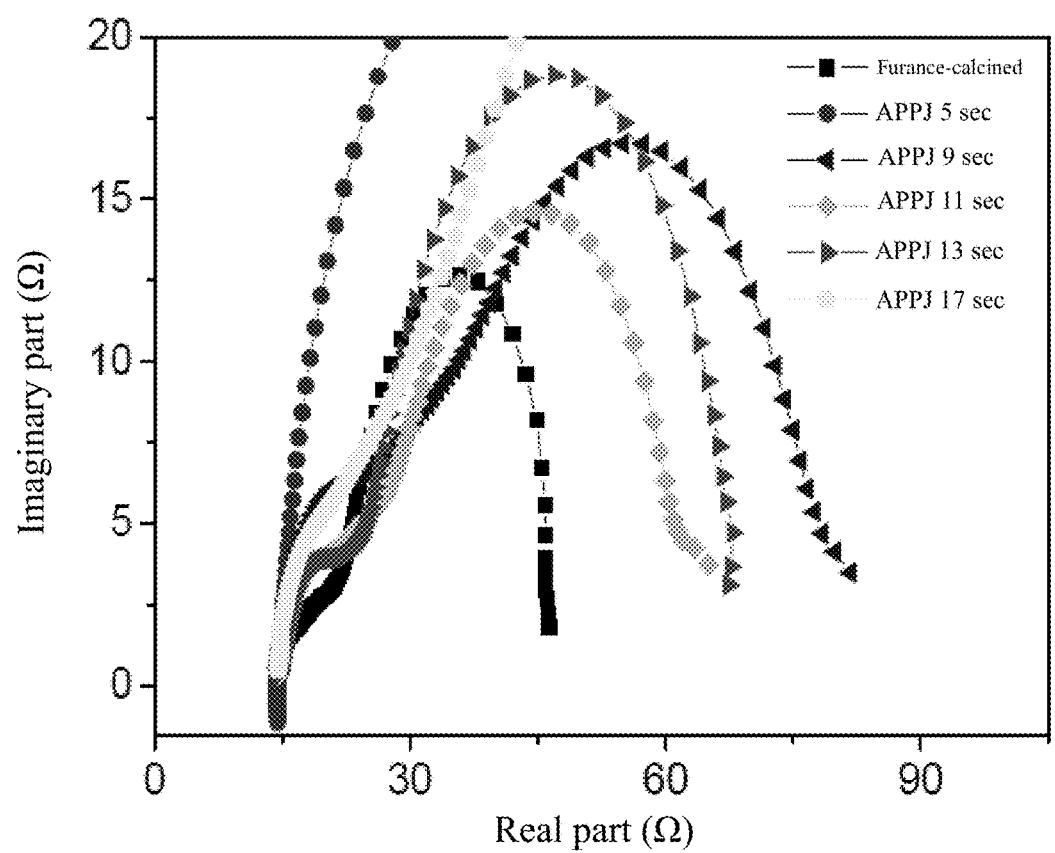
FIG. 2 is Nyquist plots of electrochemical impedance spectroscopy (EIS) of DSSCs using furnace-calcined and APPJ-treated graphene counter electrodes.

In addition, the respective Nyquist plots of EIS of the DSSCs using the two comparative and the APPJ-treated counter graphene electrodes are shown in FIG. 2. In FIG. 2, the Nyquist plot of EIS of the DSSC using the graphene electrode treated by APPJ for 1 second is not shown because its range is much greater than the others. Moreover, via the fitting of circuit model, the respective values of $R_{CE}$, the charge transfer resistance at the interface between the counter electrode and the electrolyte redox reaction, of the EISs of the DSSCs using the graphene electrodes treated by APPJ for 1, 5, 9 and 11 seconds and the furnace calcination process are obtained and shown in Table 2.

TABLE 2

| Graphene counter electrode in DSSC | $R_{CE}$ (Ω) |
|---|---|
| Furnace-calcined for 15 min | 14.26 |
| APPJ treated for 1 sec | 112.9 |
| APPJ treated for 5 sec | 44.7 |
| APPJ treated for 9 sec | 13.49 |
| APPJ treated for 11 sec | 13.39 |

As shown in Table 2, with the APPJ-treating duration increasing, the respective values of $R_{CE}$ of the DSSCs using the APPJ-treated graphene electrodes correspondingly decrease. Regarding the DSSC using the graphene electrode treated by APPJ for 11 seconds, the value of $R_{CE}$ is slightly lower than that of the DSSC using the furnace-calcined graphene electrode. Accordingly, that the catalytic ability has positive correlation with the photoelectric conversion efficiency should be a reason causing the change of efficiency.

FIGS. 3A, 3B, 3C, 3D, 3E, 3F and 3G show the images of graphene films in the above-mentioned comparative and APPJ-treated embodiments, which are observed by the scanning electron microscopy (SEM) with 1,000× magnification. FIGS. 4A, 4B, 4C, 4D, 4E, 4F and 4G show the images of graphene films in the above-mentioned comparative and APPJ-treated embodiments, which are observed by the scanning electron microscopy (SEM) with 10,000× magnification. Specifically, FIGS. 3A, 3B, 3C, 3D, 3E, 3F and 3G respectively show the magnified appearances of graphene films made without any further heating treatment (FIG. 3A), by the conventional furnace calcination process (FIG. 3B), and by the APPJ-treating process for 1, 5, 9, 11 and 13 seconds (FIGS. 3C, 3D, 3E, 3F and 3G). In addition, FIGS. 4A, 4B, 4C, 4D, 4E, 4F and 4G respectively show the magnified appearances of graphene films made without any further heating treatment (FIG. 4A), by the conventional furnace calcination process (FIG. 4B), and by the APPJ-treating process for 1, 5, 9, 11 and 13 seconds (FIGS. 4C, 4D, 4E, 4F and 4G).

Figure 3A:
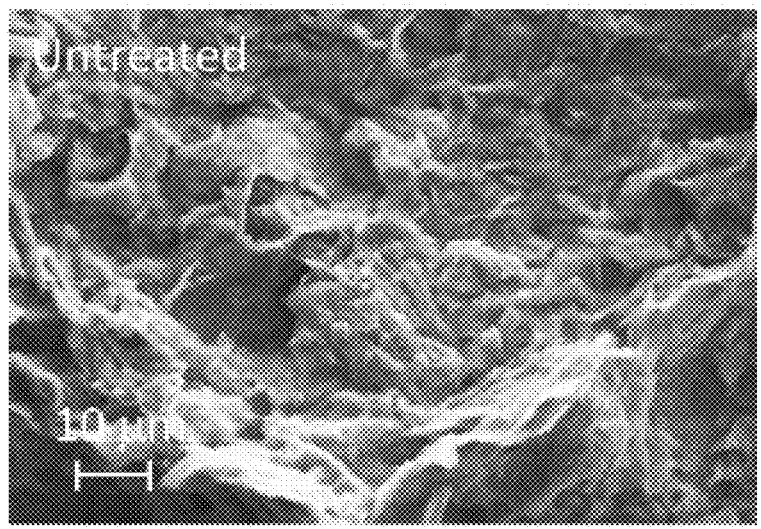
FIGS. 3A, 3B, 3C, 3D, 3E, 3F and 3G show the 1,000× magnified scanning electrode micrographs of graphene films.
Figure 3B:
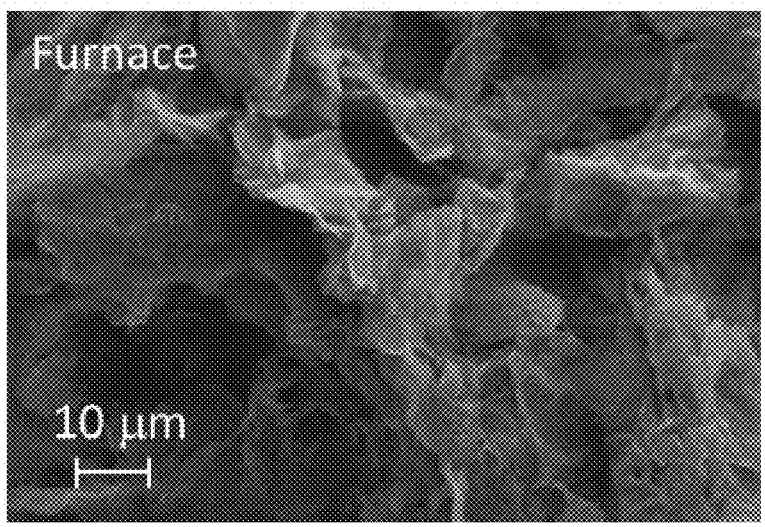
Figure 3C:
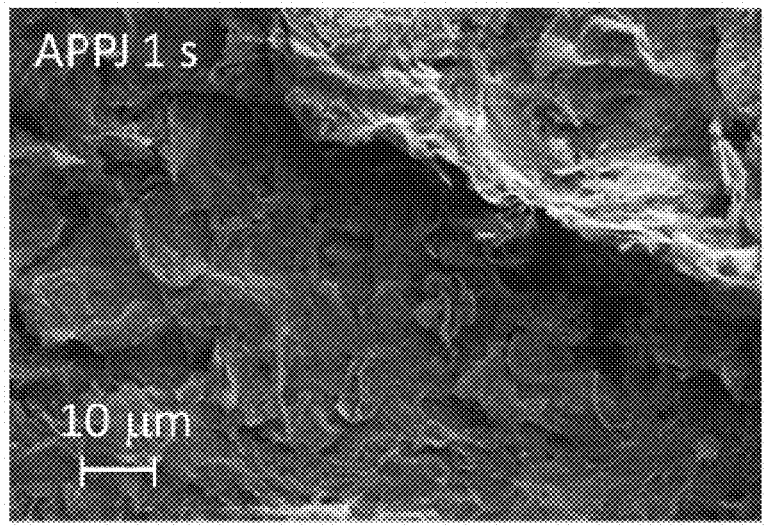
Figure 3D:
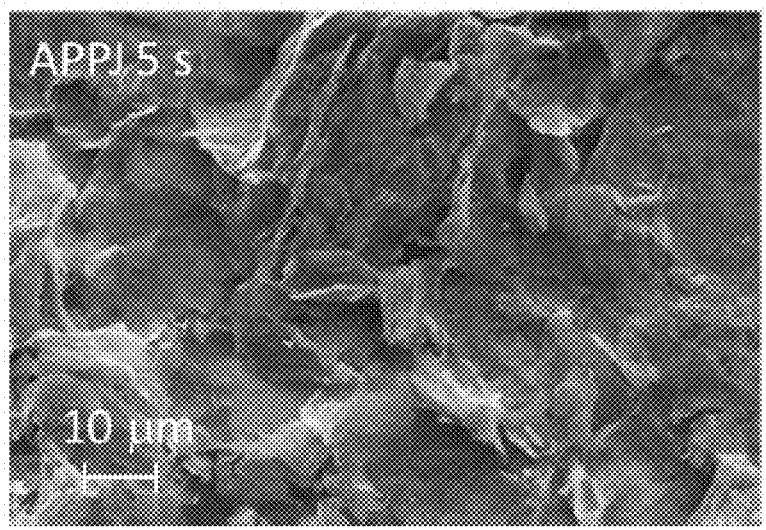
Figure 3E:
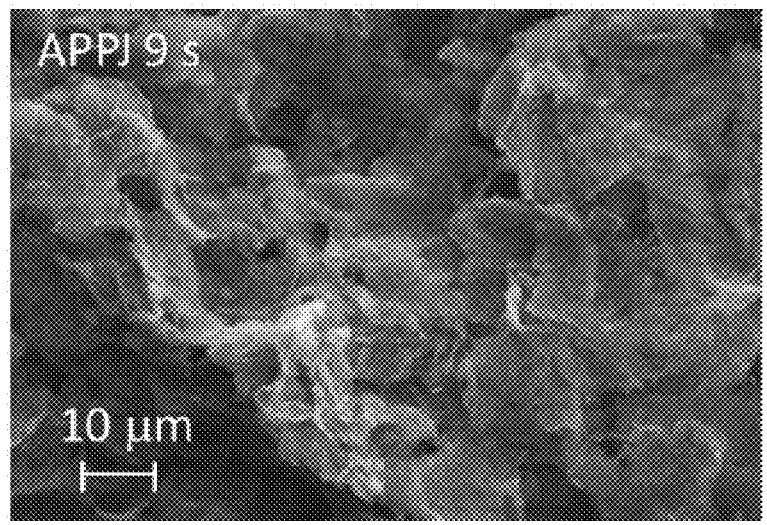
Figure 3F:
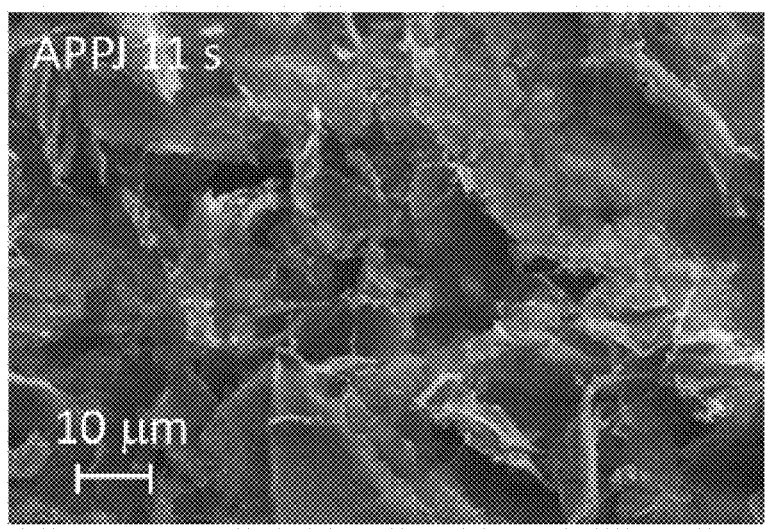
Figure 3G:
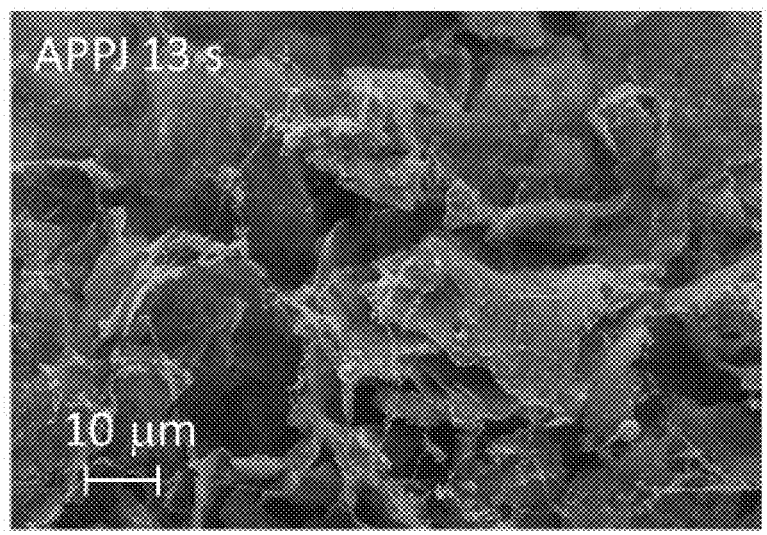

As shown in FIG. 3A, the surface of graphene film is rough but there is no visibly flaky or scaly structure thereon. In FIG. 3B, due to the removal of organics caused by furnace calcination, the sheet structure of rGO and the gaps between rGO sheets are revealed in the graphene film. As shown in FIGS. 3C to 3G, with the APPJ-treating duration increasing, in addition to the reveal of sheet structure of rGO and gaps between rGO sheets, more apparent cracks and scaly structures appear on the rGO sheets in the graphene film.

The APPJ-treated graphene film has a bottom portion and an upper portion disposed on the bottom portion, and contains rGO sheets and gaps between the sheets. The rGO sheets in the bottom portion of the APPJ-treated graphene film are in contact with the substrate. Multiple scaly structures protrude from the relatively plane rGO sheets. These scaly structures cause cracks on the rGO sheets in the APPJ-treated graphene film.

Figure 4A:
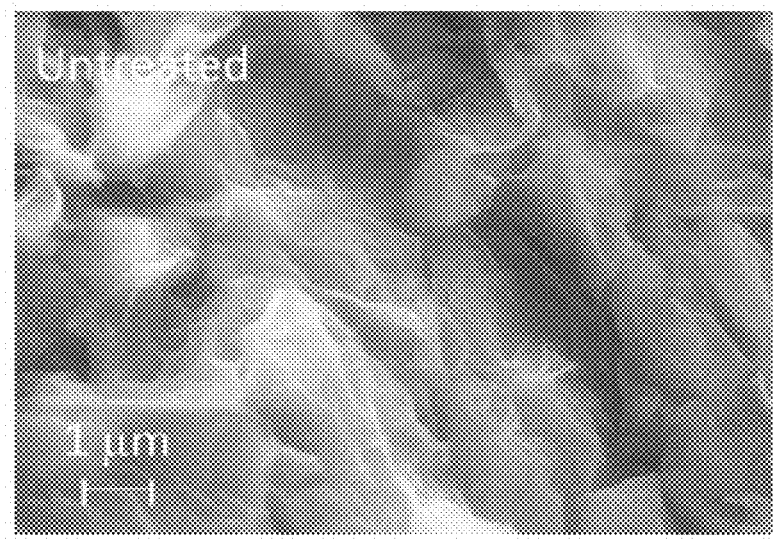
FIGS. 4A, 4B, 4C, 4D, 4E, 4F and 4G show the 10,000× magnified scanning electrode micrographs of graphene films.
Figure 4B:
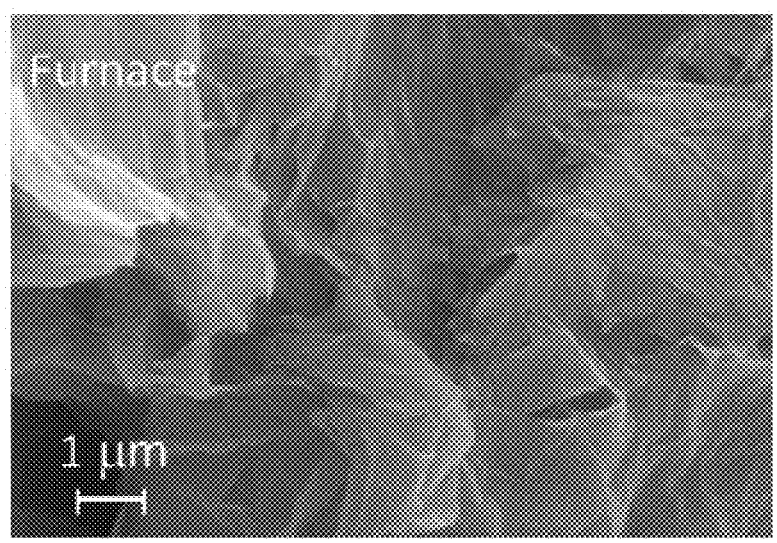
Figure 4C:
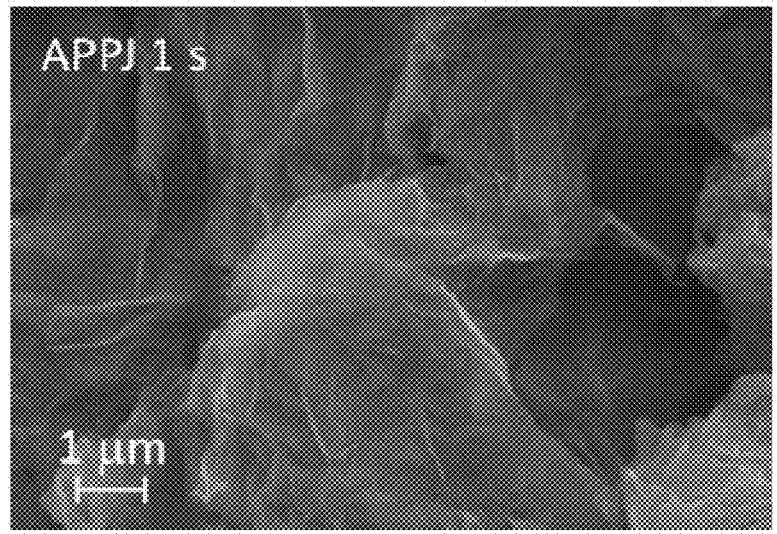
Figure 4D:
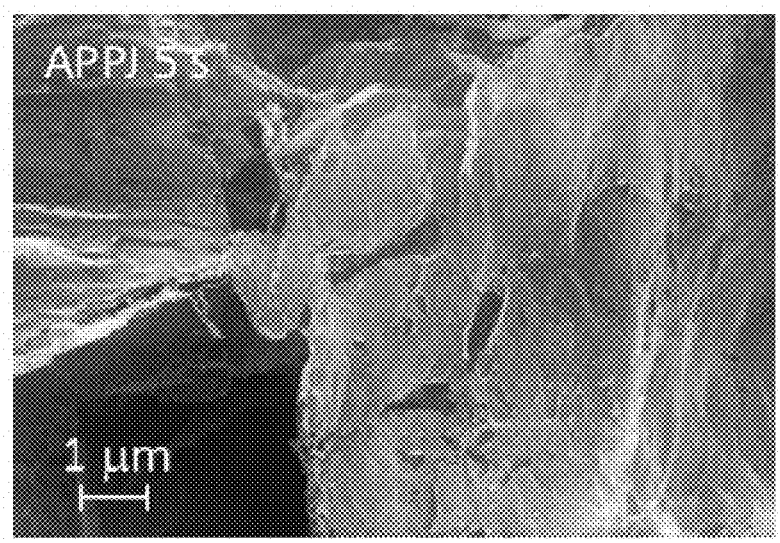
Figure 4E:
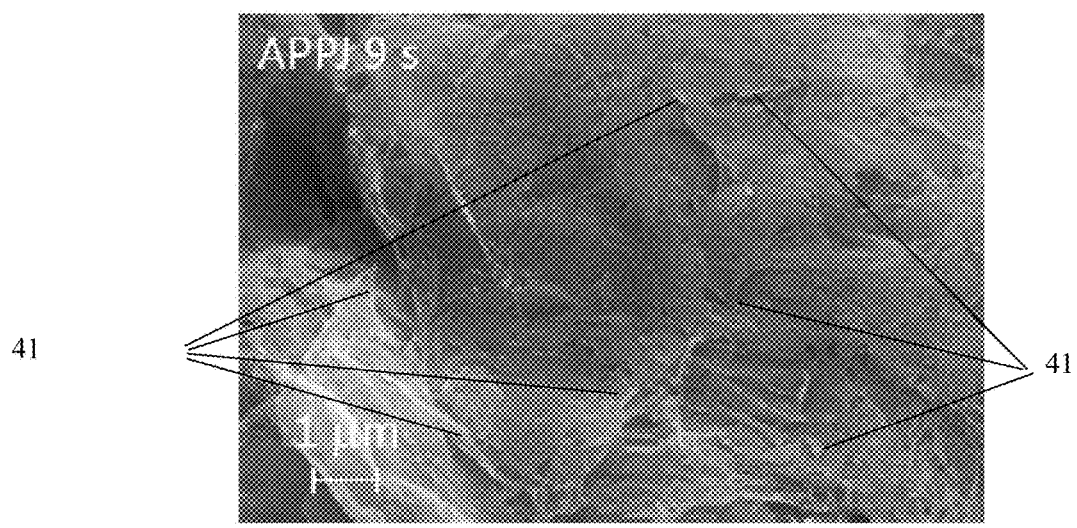
Figure 4F:
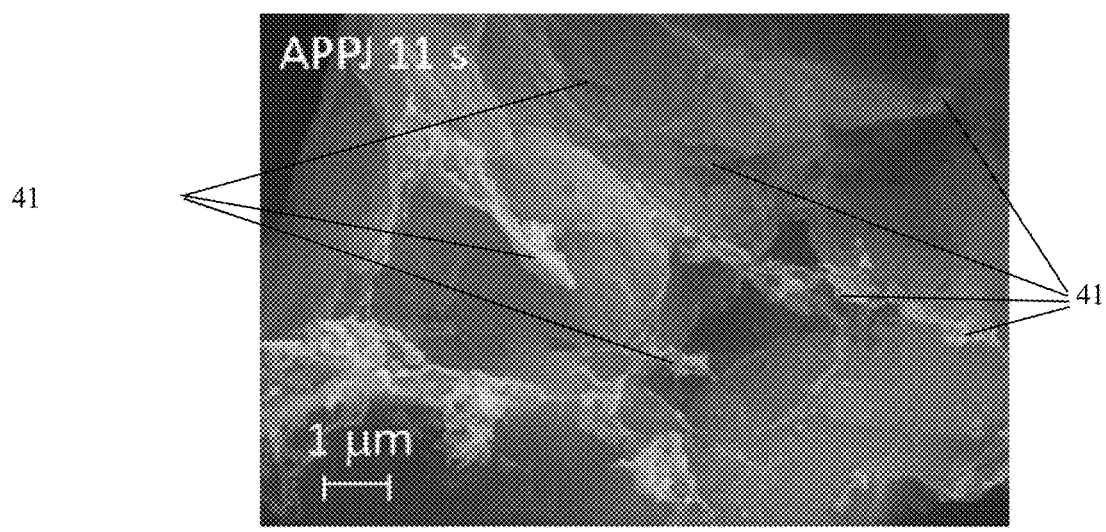
Figure 4G:
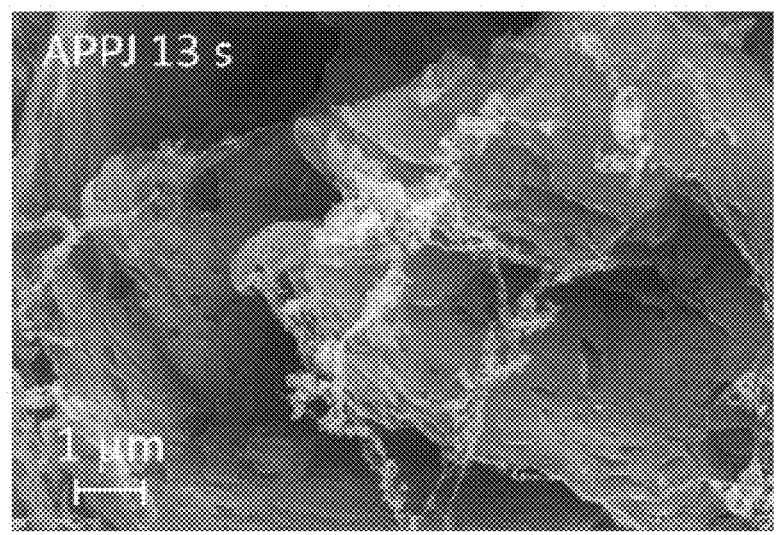

As shown in FIGS. 4E and 4F, the cracks appear on the surface of the plane graphene sheets, and plural scaly structures 41 protrude from the plane graphene sheets, which causes the graphene sheets not so plane like the graphene sheets made according to the conventional furnace calcination process. That is, when treating the baked graphene slurry, the APPJ not only removes the organics but also breaks the plane structure of graphene sheets. The defect of the graphene sheet may decrease the conductivity, but it can raise the catalytic ability. Based on the values of RCE, it can be seen that the catalytic ability of the 11 seconds-APPJ-treated graphene electrode is slightly higher that of the furnace-calcined graphene electrode. Accordingly, the APPJ treatment can rapidly remove the organics from the graphene initial material (slurry), and negative influence of the broken plane structure is compensated by the increased catalytic ability.

In an embodiment, each of the scaly structures of the APPJ-treated graphene film on the substrate has a surface opposite to the substrate. The surface of a scaly structure can be observed from a top view of the APPJ-treated graphene film as shown in any of FIGS. 3C to 3G and 4C to 4G. The surface has an edge. When a plane substrate, having an APPJ-treated graphene film thereon, is horizontally disposed, and two different points on the edge of the surface of a scaly structure of the graphene film are vertically projected on a defined horizontal plane, a linear distance between the two projected points is not longer than 10 μm.

In an embodiment, the graphene slurry has a solvent, an adhesive dissolved in the solvent and rGO powders/flakes dispersed in the solvent, where the solvent includes but is not limited to water, α-terpineol, β-terpineol, χ-terpineol, δ-terpineol, methanol, ethanol, isopropanol, acetone, and any combination thereof, and the adhesive includes but is not limited to: ester derivative of cellulose (e.g. cellulose nitrate and cellulose acetate), ether derivative of cellulose (e.g. methyl cellulose, ethyl cellulose and carboxymethyl cellulose), polyethylene glycol (PEG), polyethylene oxide (PEO), polyvinylpyrrolidone (PVP) and any combination thereof.

In an embodiment, plasma gas assorting with the APPJ includes but not limited to nitrogen, hydrogen, oxygen, argon, helium and air. In an embodiment, species of power source used to drive the APPJ includes but not limited to DC, AC, pulsed and RF. In an embodiment, species of plasma used to treat the metal precursor solution includes but not limited to plasma jet and dielectric barrier discharge plasma. Specifically, the operation pressure of the plasma is 50 mTorr to 5 atm.

The energy consumption required for producing the graphene film according to the conventional furnace calcination process is estimated as 3 kJ per square centimeter. However, for the production of the present graphene film treated by the APPJ, for example, for 11 seconds, the required energy consumption is estimated as 1.1 kJ per square centimeter. In other words, through the APPJ treatment, one-third of the energy consumption of the furnace calcination process is enough to produce a graphene film having the same area and photoelectric conversion efficiency.

In an embodiment, a method for manufacturing graphene having specific structures is provided. Specifically, the method uses an APPJ to treat slurry containing graphene initial material and coated on a substrate for an appropriate time until the slurry becomes a graphene film having plural scaly structures. In addition, the graphene film has a three-dimensional foam structure as a whole and can be seen as three-dimensional graphene foam.

In an embodiment, a treatment to APPJ-treated graphene film/foam is stopped when the graphene film/foam cures and has plural rGO sheets and multiple scaly structures and cracks on the rGO sheets.

Based on the above, it can be seen that the present disclosure at least provides an apparatus and method for manufacturing a graphene film having specific structures. The present apparatus and method can shorten the manufacturing time of the graphene film from several hours, usually required for a conventional furnace calcination process including the heating and cooling times, to only 11 seconds. Specifically, the present disclosure at least provides embodiments which use the APPJ to produce the graphene film/electrode with low energy consumption and in short time. Also, the DSSC using the present graphene electrode indeed has excellent photoelectric characteristics. Accordingly, regarding the production of the graphene film, the APPJ treatment can substitute the conventional furnace calcination process to provide a faster and more economical improvement scheme.

Embodiments

Embodiment 1 is a method for manufacturing a graphene film, comprising steps of providing a substrate, distributing a graphene slurry on the substrate, causing the graphene slurry to distribute on the substrate, and treating the graphene slurry distributed on the substrate with an atmospheric pressure plasma jet (APPJ) to form the graphene film.

Embodiment 2 is an embodiment described in Embodiment 1, where the substrate is electrically conductive.

Embodiment 3 is an embodiment described in Embodiment 2, where the graphene film covers and is fixed on the substrate, causing the substrate to form an electrode.

Embodiment 4 is an embodiment described in Embodiment 1, further comprising a step of treating the graphene slurry on the substrate with the APPJ within thirty seconds once the substrate temperature reaches a certain working temperature.

Embodiment 5 is an embodiment described in Embodiment 1, where treating is stopped when the graphene film cures, and the graphene film in contact with the substrate at its bottom has plural reduced graphene oxide (rGO) sheets, and multiple scaly structures and cracks on the rGO sheets.

Embodiment 6 is an embodiment described in Embodiment 5, where each of the multiple scaly structures has a surface opposite to the substrate, the surface has an edge, and when two different points on the edge are vertically projected on a defined horizontal plane, a linear distance between the two projected points is not longer than 10 μm.

Embodiment 7 is an embodiment described in Embodiment 1, where the graphene slurry has a solvent, an adhesive dissolved in the solvent and rGO powders/flakes dispersed in the solvent, the solvent is one selected from the group consisting of water, α-terpineol, β-terpineol, χ-terpineol, δ-terpineol, methanol, ethanol, isopropanol, acetone, and any combination thereof, and the adhesive is one selected from the group consisting of a cellulose ester derivative, a cellulose ether derivative, polyethylene glycol (PEG), polyvinylpyrrolidone (PVP) and any combination thereof.

Embodiment 8 is a method for manufacturing a three-dimensional graphene foam, comprising steps of providing a graphene slurry, and treating the graphene slurry with an atmospheric pressure plasma jet (APPJ) to form the three-dimensional graphene foam.

Embodiment 9 is an embodiment described in Embodiment 8, further comprising steps of providing a substrate, and distributing the graphene slurry on the substrate.

Embodiment 10 is an embodiment described in Embodiment 8, where treating is stopped when the graphene foam cures, and the graphene foam in contact with the substrate at its bottom has plural reduced graphene oxide (rGO) sheets, and multiple scaly structures and cracks on the rGO sheets.

Embodiment 11 is an embodiment described in Embodiment 10, where each of the multiple scaly structures has a surface opposite to the substrate, the surface has an edge, and when two different points on the edge are vertically projected on a defined horizontal plane, a linear distance between the two projected points is not longer than 10 μm.

Embodiment 12 is an embodiment described in Embodiment 8, where the graphene slurry has a solvent, an adhesive dissolved in the solvent and rGO powders/flakes dispersed in the solvent, the solvent is one selected from the group consisting of water, α-terpineol, β-terpineol, χ-terpineol, δ-terpineol, methanol, ethanol, isopropanol, acetone, and any combination thereof, and the adhesive is one selected from the group consisting of a cellulose ester derivative, a cellulose ether derivative, polyethylene glycol (PEG), polyvinylpyrrolidone (PVP) and any combination thereof.

Embodiment 13 is an embodiment described in Embodiment 8, further comprising a step of treating the graphene slurry on the substrate with the APPJ within thirty seconds once the substrate temperature reaches a certain working temperature.

Embodiment 14 is a system for manufacturing a graphene film, comprising a substrate having a graphene slurry disposed thereon, and an atmospheric pressure plasma jet (APPJ) treating the graphene slurry to form the graphene film on the substrate.

Embodiment 15 is an embodiment described in Embodiment 14, where the substrate is electrically conductive.

Embodiment 16 is an embodiment described in Embodiment 15, where the graphene film covers and is fixed on the substrate, causing the substrate to form an electrode.

Embodiment 17 is an embodiment described in Embodiment 14, further comprising a supporting device bearing the substrate, and a plasma generator generating the APPJ, where the APPJ treats the graphene slurry distributed on the substrate.

Embodiment 18 is an embodiment described in Embodiment 14, where treating is stopped when the graphene film cures, and the graphene film is in contact with the substrate at its bottom, and has plural reduced graphene oxide (rGO) sheets, and multiple scaly structures and cracks on the rGO sheets.

Embodiment 19 is an embodiment described in Embodiment 18, where each the plural scaly structures has a surface opposite to the substrate, the surface has an edge, and when two different points on the edge are vertically projected on a defined horizontal plane, a linear distance between the two projected points is not longer than 10 μm.

Embodiment 20 is an embodiment described in Embodiment 14, where the graphene slurry has a solvent, an adhesive dissolved in the solvent and reduced graphene oxide (rGO) powders/flakes dispersed in the solvent, the solvent is one selected from the group consisting of water, α-terpineol, β-terpineol, χ-terpineol, δ-terpineol, methanol, ethanol, isopropanol, acetone, and any combination thereof, and the adhesive is one selected from the group consisting of a cellulose ester derivative, a cellulose ether derivative, polyethylene glycol (PEG), polyvinylpyrrolidone (PVP) and any combination thereof.

While this disclosure is described in terms of what is presently considered to be the most practical and preferred embodiments, it is to be understood that the disclosure is not limited to the disclosed embodiments. Therefore, it is intended to cover various modifications and similar arrangements included within the spirit and scope of the appended claims, which are to be accorded with the broadest interpretation so as to encompass all such modifications and similar structures.

What is claimed is:

1. A method for manufacturing a reduced graphene oxide (rGO) film, comprising steps of:
   providing a substrate;
   distributing a reduced graphene oxide (rGO) slurry having a solvent on the substrate;
   evaporating the solvent in the rGO slurry to form a reduced graphene oxide (rGO)-containing precursor film on the substrate; and
   treating the reduced graphene oxide (rGO)-containing precursor film on the substrate with an atmospheric pressure plasma jet (APPJ) to form the rGO film, wherein the treating step is kept up for a period of not more than thirteen seconds once the substrate temperature reaches 450° C.

2. The method as claimed in claim 1, wherein the substrate is electrically conductive.

3. The method as claimed in claim 1, wherein the rGO film forms an electrode on the substrate.

4. The method as claimed in claim 1, wherein the treating step is stopped when the rGO-containing precursor film becomes the rGO film, the rGO film contains plural reduced graphene oxide (rGO) sheets having flaky structures protruded therefrom and cracks contained therein, each of the flaky structures has a bottom portion and an upper portion connected thereto, the bottom portion is directly in contact with at least one of the plural rGO sheets; and the upper portion is protruded from the at least one of the plural rGO sheets.

5. The method as claimed in claim 4, wherein the flaky structures include surfaces, wherein the surfaces of the flaky structures have edges, and a linear distance between two projection points vertically projected from any two different points lying on any one of the edges onto a surface of the substrate is not longer than 10 µm.

6. The method as claimed in claim 1, wherein the rGO slurry has a solvent, an adhesive dissolved in the solvent and reduced graphene oxides (rGOs) dispersed in the solvent, the solvent is one selected from the group consisting of water, $\alpha$-terpineol, $\beta$-terpineol, $\chi$-terpineol, $\delta$-terpineol, methanol, ethanol, isopropanol, acetone, and any combination thereof, and the adhesive is one selected from the group consisting of a cellulose ester derivative, a cellulose ether derivative, polyethylene glycol (PEG), polyvinylpyrrolidone (PVP) and any combination thereof.

\* \* \* \* \*